United States Patent [19]

Hamano

[11] Patent Number: 4,931,128
[45] Date of Patent: Jun. 5, 1990

[54] ELECTRONIC PARTS PROCESSING MACHINE

[75] Inventor: Junichi Hamano, Hyogo, Japan

[73] Assignee: Takasago Electric Industry Co., Ltd., Osaka, Japan

[21] Appl. No.: 245,415
[22] PCT Filed: Feb. 4, 1988
[86] PCT No.: PCT/JP88/00107
   § 371 Date: Aug. 15, 1988
   § 102(e) Date: Aug. 15, 1988
[87] PCT Pub. No.: WO88/05957
   PCT Pub. Date: Aug. 11, 1988

[30] Foreign Application Priority Data

Feb. 6, 1987 [JP] Japan .................................. 62-26868
Mar. 19, 1987 [JP] Japan .................................. 62-67537

[51] Int. Cl.5 ............................ B65C 9/40; B65C 9/06
[52] U.S. Cl. ..................................... 156/362; 156/542;
   156/556; 156/567; 156/569; 156/DIG. 25;
   156/DIG. 33; 221/120
[58] Field of Search ............... 156/542, 567, 569, 541,
   156/556, DIG. 25, DIG. 33, 384, 362; 221/115,
   120; 222/169, 171

[56] References Cited

U.S. PATENT DOCUMENTS

| | | | |
|---|---|---|---|
| 3,294,284 | 12/1966 | Chambers | 221/120 |
| 4,287,016 | 9/1981 | Kerwin et al. | 156/542 |
| 4,369,089 | 1/1983 | Mohn et al. | 156/DIG. 25 |
| 4,647,235 | 3/1987 | Sato | 156/542 |

FOREIGN PATENT DOCUMENTS 61-237297 10/1986 Japan .
62-3489 1/1987 Japan .
62-22296 1/1987 Japan .

*Primary Examiner*—Michael W. Ball
*Assistant Examiner*—Michele K. Yoder
*Attorney, Agent, or Firm*—Jordan and Hamburg

[57] ABSTRACT

An electronic parts processing machine for continuously performing processed like writing information to electronic parts concludes a carrying portion for transferring the electronic parts to be processed, a supplying portion which is disposed upstream to the carrying portion and connects a tray containing many electronic parts in line to the carrying portion and supports the tray, a processing portion which is disposed in the carrying portion and perform predetermined information processing for the electronic parts supplied from the tray, an indicating portion for making a predetermined indication for the electronic parts located downstream or upstream to the processing portion, a collecting portion which is disposed downstream to the carrying portion and connects a tray to the carrying portion and supports the tray to receive processed electronic parts. The machine eliminates troublesome operations such as attaching and detaching the electronic parts to and from the sockets or labeling the processed electronic parts manually as in the case of the conventional P-ROM writer, thus enabling automatic and continuous processing of the parts.

22 Claims, 10 Drawing Sheets

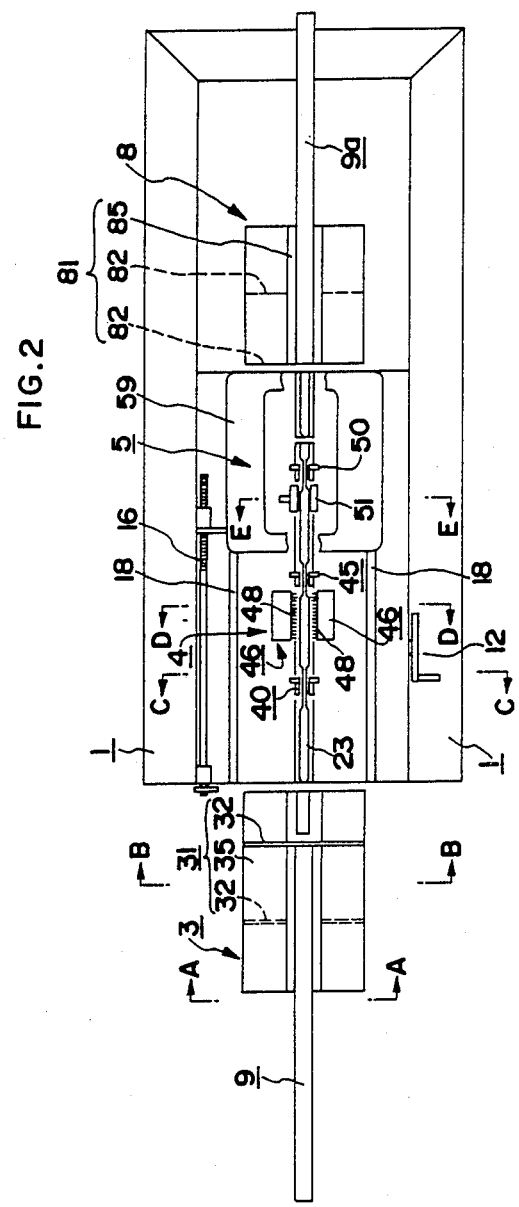

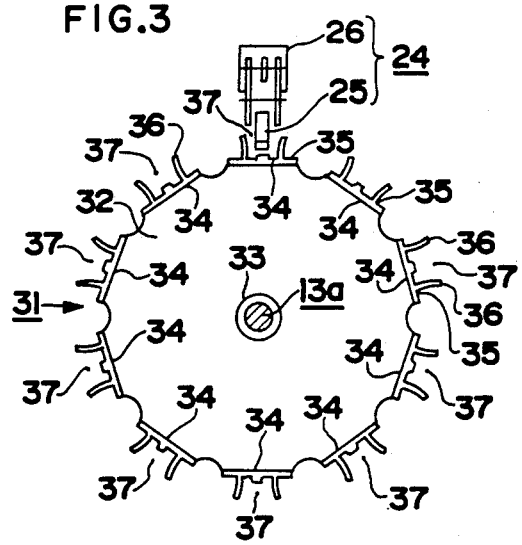
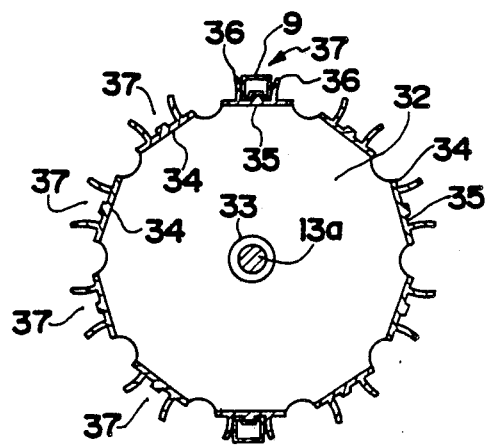

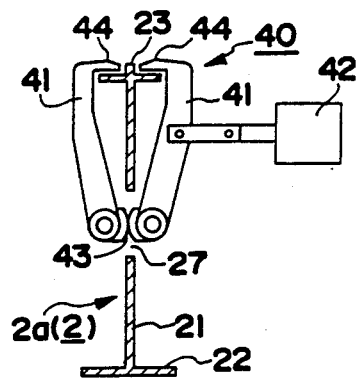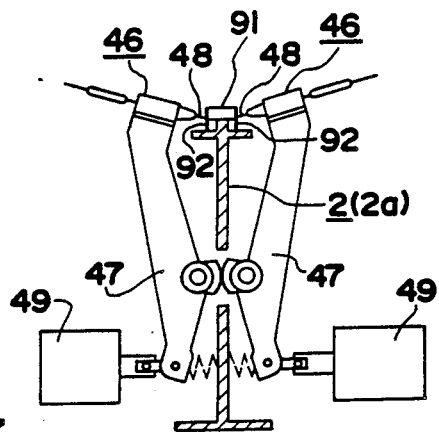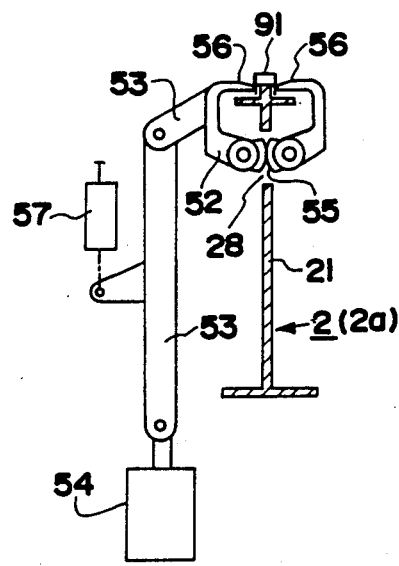

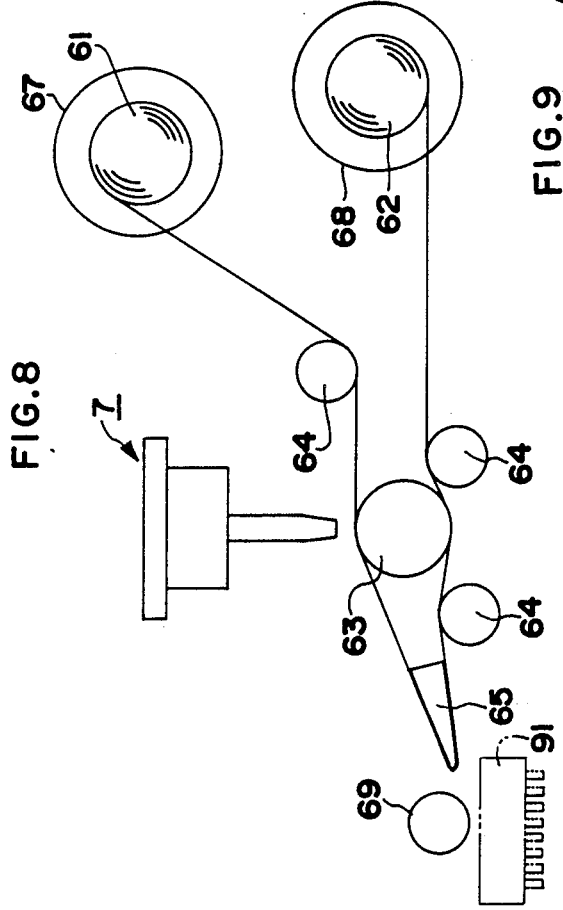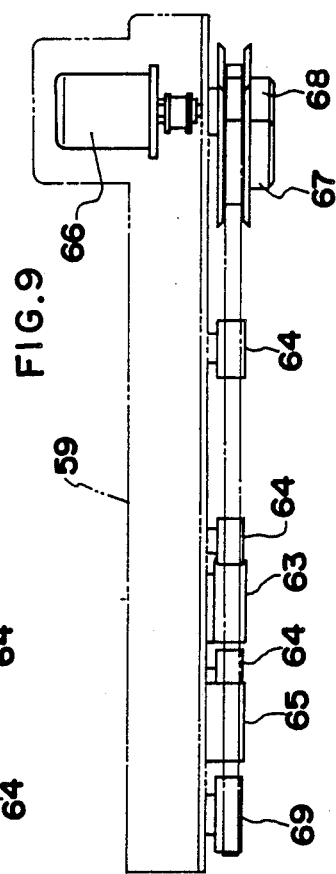

ELECTRONIC PARTS PROCESSING MACHINE

FIELD OF THE INVENTION

This invention relates to an electronic parts processing machine for continuously writing or reading programs or data (hereinafter called "information") to or from the electronic parts such as P-ROMs or EP-ROMs.

BACKGROUND OF THE INVENTION

Heretofore, as regards electronic parts processing machines of this type, the P-ROM writer is available. This P-ROM writer is provided with a keyboard, an operation mode indicator and a digital display on a front panel, on which one or more sockets are equipped. In writing information using this P-ROM writer, at first an electronic part to be modeled is inserted into the socket to set it on the P-ROM writer as model information, then unprocessed parts are inserted into the sockets and the model information is written into the parts.

Now, in using the P-ROM writer, the number of the parts which can be processed at the same time is equal to the number of sockets provided on the front panel, therefore the P-ROM writer not only is unsuitable for mass processing but also encounters difficulties in attaching and detaching the parts to and from the sockets or labeling processed parts, thereby causing problems including increased costs.

The present invention has been made to solve these problems, and therefore it is an object of the present invention to provide a novel electronic parts processing machine which performs writing or reading information to or from the electronic parts and surface processing of labeling the parts in sequence on a transfer path and to automate these processings.

DISCLOSURE OF THE INVENTION

The electronic parts processing machine according to the present invention implements writing or reading of information continuously, and comprises a carrying portion which transfers the electronic parts to be processed, a supplying portion which is disposed upstream to the carrying portion and connects a tray containing many parts in line to the carrying portion and supports the tray, a processing portion which is provided on the carrying portion and executes predetermined information processing for the electronic parts supplied from the tray, an indicating portion which makes a predetermined indication for the electronic parts located downstream or upstream to the processing portion, a collecting portion which is disposed downstream to the carrying portion and connects a tray to the carrying portion and supports the tray to receive processed parts.

In using the electronic parts processing machine according to the present invention, when the electronic part is carried out one by one from the supply portion, the part passes through the carrying portion and stops at the processing portion to receive predetermined processings such as writing. Further, the part stops at the indicating portion to get a predetermined indication on its surface and thereafter the processed part is transferred again and is collected at the collecting portion. Therefore, the electronic parts processing machine according to the present invention can eliminate troublesome operations such as attaching and detaching the electronic parts to and from the P-ROM writer sockets or labeling the processed parts manually, thereby enabling automatic and continuous processing of the parts.

BRIEF DESCRIPTION OF THE DRAWINGS

FIG. 2 is a plan view showing the machine of FIG. 1, FIG. 3 is a sectional view taken along line A—A of FIG. 2, FIG. 4 is a sectional view taken along line B—B of FIG. 2, FIG. 5 is a sectional view taken along line C—C of FIG. 2, FIG. 6 is a sectional view taken along line D—D of FIG. 2, FIG. 7 is a sectional view taken along line E—E of FIG. 2, FIG. 8 is an enlarged front view showing a labeling apparatus, FIG. 9 is a plan view of FIG. 8.

MOST PREFERABLE EMBODIMENT OF THE INVENTION

Figure 1:
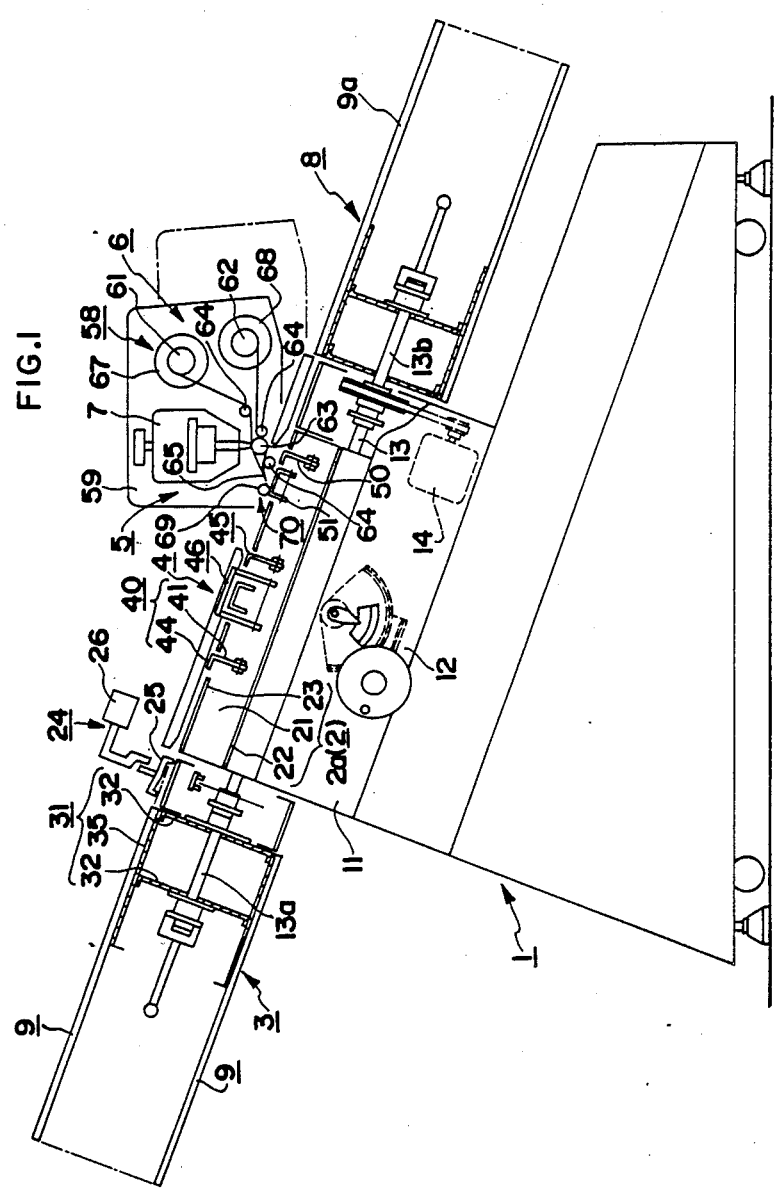
FIG. 1 is a front view showing one embodiment of the electronic parts processing machine according to the present invention.
Figure 10:
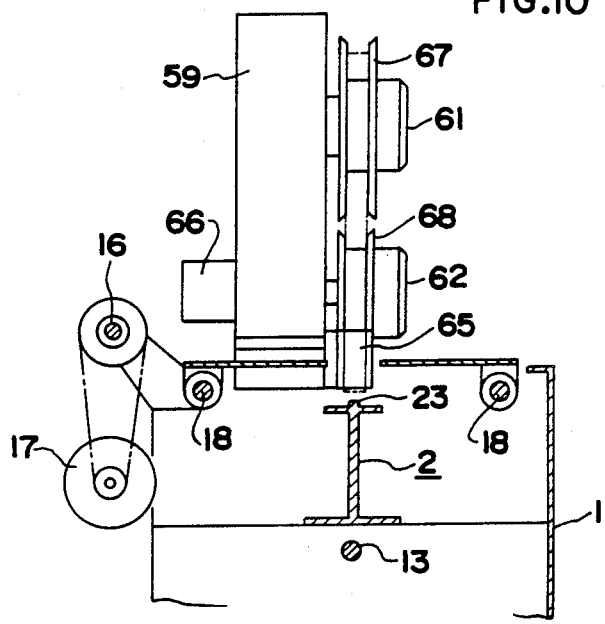
FIG. 10 is a sectional view showing a table drive mechanism and the labeling apparatus.

The drawings show one example of the electronic parts processing machine according to the present invention and FIG. 1 is its front view, and FIG. 2 is its plan view.

The illustrated electronic parts processing machine is used for continuous writing of programs into electronic parts such as P-ROMs or EP-ROMs, but the present invention is not limited to this illustration and can be applied to a machine which performs continuous reading of information from electronic parts of this type and further applied to a machine which performs, for example, programming to built hard logic in a PAL (Programmable Array Logic).

The illustrated machine comprises a carrying portion 2 which is located on an upper portion of a machine table 1 and intermittently transmits the electronic parts, a supplying portion 3 which is disposed adjacently and upstream to the carrying portion 2 and has trays 9 containing many electronic parts in line, a processing portion 4 which is provided in the carrying portion 2 and implements writing of predetermined information into the parts supplied from the tray 9, an indicating portion 5 which is located downstream to the processing portion 4 and which makes a predetermined indication for the processed parts, a collecting portion 8 which is disposed downstream to the carrying portion 2 and connects a tubular tray 9a to the carrying portion 2 and supports the tray to collect processed parts, and a control portion (not shown) which centrally controls the operation of each mechanism or data input/output operations.

On the upper portion of the machine table 1, a mounting frame 11 is provided, which is so made that its angle of inclination can be freely adjusted by an angle adjusting mechanism 12.

Figure 13:
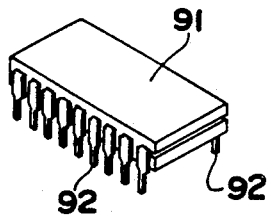
FIG. 13 is a perspective view showing one example of the electronic parts.

The carrying portion 2 is constructed by mounting an inclination guide 2a on the mounting frame 11. This inclination guide 2a is a mold made of high lubricative plastics. A mounting wall 22 fixed to the mounting frame 11 is formed beneath a supporting wall 21 having a suitable height, and on the upper portion of the supporting wall 21, a parts guide face 23 is formed which engages the gaps between electrodes 92 of the electronic part 91 shown in FIG. 13, thereby guiding the part 91 along an inclined surface.

Figure 12:
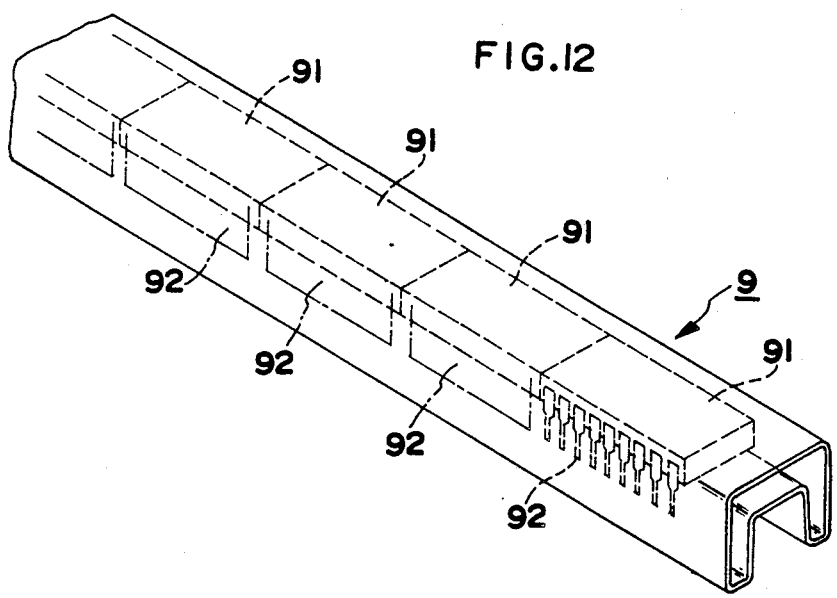
FIG. 12 is a perspective view of a tubular tray.

In the supply portion 3, one end of a rotating drive shaft 13 is located and the shaft extends into the mounting frame 11 of the carrying portion 2 along the inclination and is linked to a stepping motor 14. Both ends of the drive shaft 13 are projected outside the mounting frame 11, and a projected shaft portion 13a on the upstream side is attachably and detachably provided with a tray support frame 31 on the axis. As shown in FIGS. 1–4, this tray supporting frame 31 is equipped with two opposite disk frame plates 32, 32 each of which is provided with a bearing member 33 at its center and a plurality of attaching sides 34 that are formed on the periphery of the disk frame plate 32 with equal spacings. The frame 31 is also equipped with tray supporting plates 35 disposed between the opposite attaching sides 34 of both disk frame plates 32, that is, these plates are arranged in a cylindrical shape. Each supporting plate 35 is formed with a tray engaging gutter 37 with parallel standing up walls 36, 36 and each engaging gutter 37 mounts attachably and detachably a tubular tray 9 as shown in FIG. 12.

When the stepping motor 14 is step-driven, the tray supporting frame 31 intermittently rotates by a spacing between the trays 9—9 and each tray 9 stops at a point on an extension of the inclination guide 2a in response to detection of a tray position by a position sensor.

Between the inclination guide 2a and the tray supporting frame 31, an open-close mechanism 24 for making the electronic part 91 escape from the tray 9 (refer to FIG. 12) one by one is provided.

This open-close mechanism 24 is comprised of a swinging type open-close lever 25 which is disposed opposite to an opening of the tubular tray 9 and a solenoid 26 which swings this open-close lever 25. Thus, the electronic parts 91 in the tray 9 are carried out one by one into the carrying portion 2 by swinging motion of the open-close lever 25. On the upstream side of the carrying portion 2, a stopper 40 is provided which has one electronic part 91 supplied from the tray 9 wait on an upstream side of the processing portion 4.

As shown in FIG. 5, this stopper 40 is comprised of a pair of swinging arms 41 which appear and disappear in a parts path of the inclination guide 2a to block their passage and a solenoid 42 which actuates the swinging arms 41. Both arms 41, 41 are disposed opposite to each other on both sides of the inclination guide 2a and pivotally fixed at each end. Beneath both arms 41, a gear portion 43 is formed in one body and the gears engage with each other at a penetrated hole 27. One arm 41 links the solenoid 42. At the upper ends of both arms 41, a stopping pieces 44 are formed which appear and disappear at the part guide face 23. By opening motion of this stopper 40 the electronic parts 91 are taken out one by one from the supply portion 3 and transmitted to the processing portion 4.

Returning to FIGS. 1 and 2, the processing portion 4 is comprised of a stopper 45 which stops the electronic part 91 at a predetermined position and a writing portion 46 which writes predetermined information to the part 91 stopped by the stopper 45. The stopper 45 has the same structure as the above stopper 40 on the upstream side, so the explanation thereof is omitted.

As shown in FIGS. 1, 2 and 6, the writing portion is comprised of a pair of arms 47, 47 which are disposed opposite to each other on both sides of the inclination guide 2a and a plurality of writing terminals 48 which are formed at each end of the arm 47 and electrically connected to a control portion (not shown). A lower part of each arm 47 links a solenoid 49 and when these solenoids 49 actuate both arms 47, the writing terminal 48 corresponding to each electrode 92 of the electronic part 91 contacts the electrode 2 to write predetermined information by an electric signal issued from the control portion.

On the downstream side of the processing portion 4, the indicating portion 5 is provided and a label written in with characters and symbols indicative of written information is affixed on a surface of a processed part 91. In addition, this indicating portion 5 may be disposed upstream to the processing portion 4. The indicating portion 5 illustrated is comprised of a stopper 50 which stops the processed part 91 at a predetermined position, and a centering mechanism 51 which affixes a label on the surface of the part. Further, the stopper 50 has the same structure as the above stoppers 40, 45, and therefore, the explanation thereof is omitted.

As shown in FIG. 7, the centering mechanism 51 includes a pair of centering arms 52, 52 which are disposed on both sides of the inclination guide 2a and a solenoid 54 which is connected to one centering arm 52 via a link 53. In pivotally fixed portions of both arms 52, 52, gears 55 are provided to engage with each other at a position of a penetrating hole 28. At an upper end of each arm 52, nail pieces 56, 56 are formed which are used to grip the electronic part 91 from both sides. On a link 53 connecting the solenoid 54 and the arm 52, a dashpot 57 is mounted, which adjusts the grip force of the nail pieces 56 which are produced by the solenoid 54.

As shown in FIGS. 1–2 and 8–10, a labeler 58 is provided with a ball screw 16 and two guide axes 18, 18 all adjusted in parallel with the inclination guide 2a on the machine table 1. A rotation-reversible drive motor 17 is linked to the ball screw 16. Thus a table 59 is so mounted that it can reciprocate on the ball screw 16 and the guide axes 18. This table 59 is equipped with a labeling apparatus 6, a printer 7 and a push roller 69. The push roller 69 and the table 59 reciprocating mechanism constitute a labeling mechanism 70.

The above labeling apparatus 6 is comprised of real spindles 61, 62 which are provided on the upper and lower portions of the table 59, a supporting roller 63 which is disposed corresponding to the position of the printer 7, tension rollers 64 which are located on lower both sides of the roller 63 and further between the supporting roller 63 and the real spindle 61, and a label peel off guide 65 which is disposed downstream to the push roller 69. The reel spindle 62 on the lower portion of the table is linked to a stepping motor 66 which operates intermittently.

Labels applied to this labeling apparatus 6 are stuck, in great numbers, to a long-rolled paraffin paper tape with equal spacings. A reel 67 rolled up with this tape is fitted to the reel spindle 61. The tape drawn out from the reel 67 passes the tension roller 64 and the upper periphery of the supporting roller 63, then turns at the peel off guide 65, then passes the tension roller 64 and the lower periphery of the supporting roller 63 and is guided by the take-up reel 68. This tape is transferred toward the take up reel by a label spacing by the intermittent motion of the stepping motor 66 to stop a label at an uppermost surface of the supporting roller 63.

The printer 7 is disposed opposite to the upper periphery of the supporting roller 63 and is actuated in response to a control signal transmitted from the control portion to print data onto a stopped label.

The labeling mechanism 70 adjusts the position of the label peel off guide 65 to the stop position of the processed part 91 and makes the tape and the table 59 transfer equal distance, thereby attaining labeling operation. When the tape turns at the peel off guide 65, a label on the tape is pushed out from the tip of the peel off guide 65 and simultaneously the table 59 moves, thereby, the label is left on a surface of the corresponding part 91 and affixed to it in one body by push action of a pushing roller 69.

In the collecting portion 8, in the same way as the supplying portion 3, the drive shaft 13 in the mounting frame 11 of the carrying portion 2 are projected outside the mounting frame 11 and a projected shaft portion 13b is attachably and detachably provided with a tray supporting frame 81 on the axis.

Figure 11:
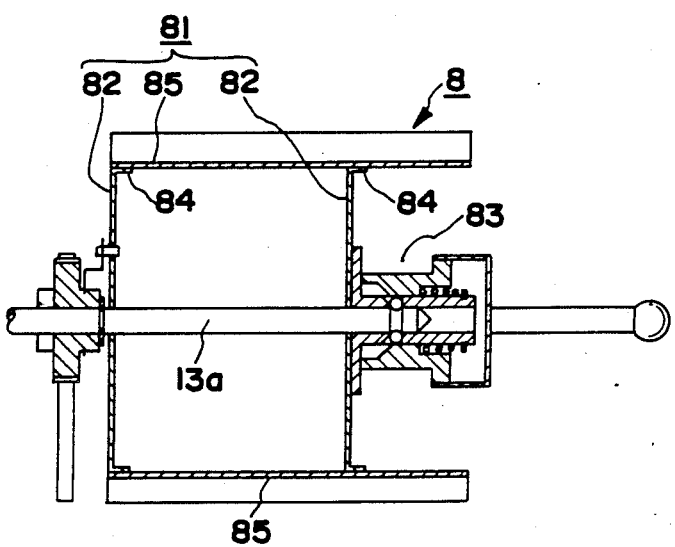
FIG. 11 is a sectional view of the collecting portion.

As shown in FIG. 11, similarly to the supplying portion 3, the tray supporting frame 81 is equipped with two opposite disk frame plates 82, 82 each of which is provided with a bearing member 83 at its center and a plurality of attaching sides 84 that are formed on a periphery of the disk frame plate 82. The frame 81 is also equipped with tray supporting plates 85 disposed between the opposite attaching side 84, 84 of both disk frame plates 82, thus these plates are arranged in a cylindrical shape.

The control portion (not shown) which controls operations of the mechanism or data input/output operation includes a PCU as a control main, ROMs containing programs for such as automatic writing of information, RAMs used to read/write various data, a key operating portion for data input, a display portion for displaying input/output data. Information which is to be written by the writing portion 46 or data which is to be printed by the printer 7 are previously given to the control portion by operating the key of the control portion.

Further, the indicating portion 5 is not limited to the type of this embodiment, but a type which stamps given characters on a label may be used or a type which prints or stamps given characters directly on the electronic part surface may also be used.

Figure 14:
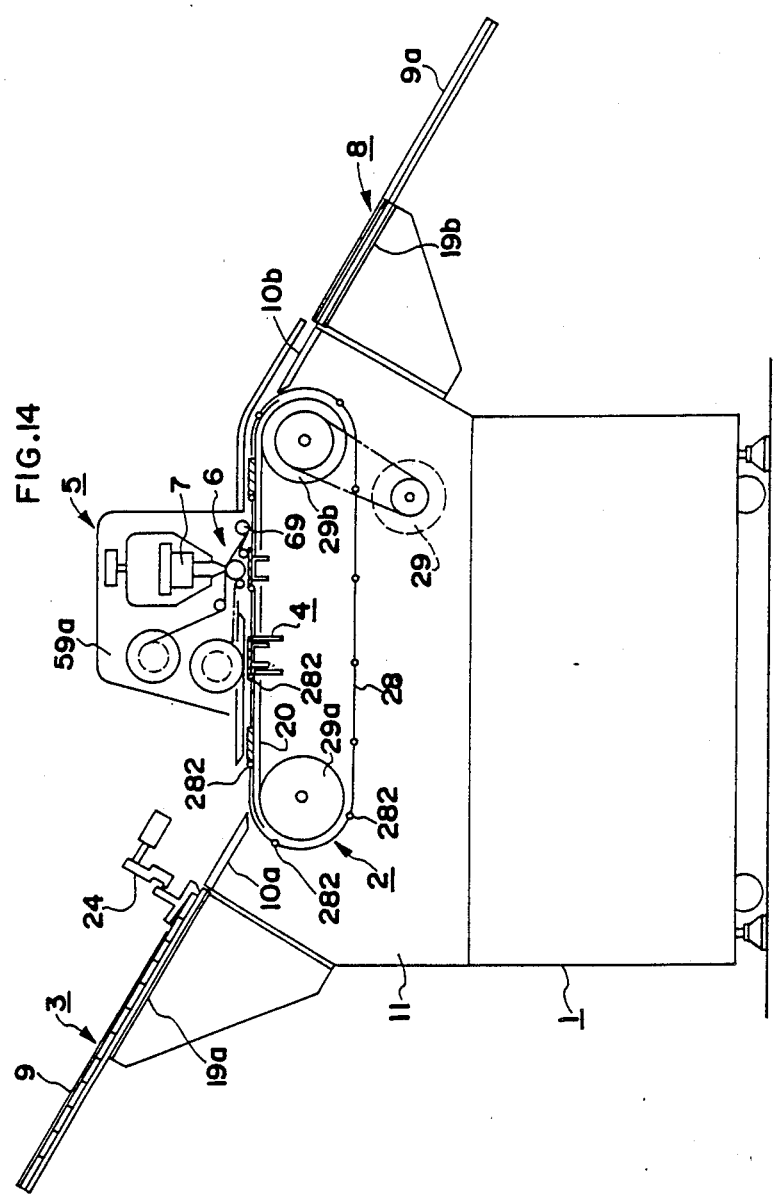
FIG. 14 is a front view showing other embodiment of the electronic parts processing machine.
Figure 15:
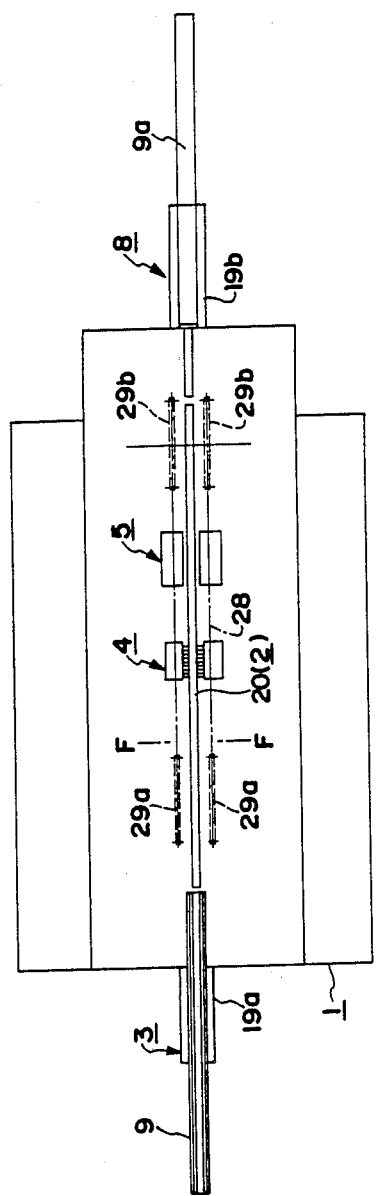
FIG. 15 is a plan view of the machine of FIG. 14.
Figure 16:
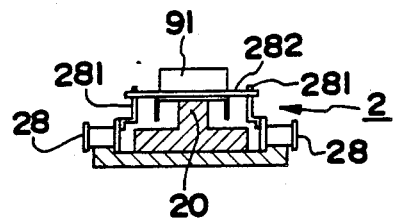
FIG. 16 is a sectional view taken along line F—F of FIG. 15.

FIG. 14–16 shows the other embodiment of the electronic parts processing machine according to the present invention. This embodiment is so constructed that its carrying portion 2 is horizontally disposed and is comprised of a horizontal carrying guide 20 which performs sliding guide of the parts 91 and two lines of carrying chains 28, 28 which are disposed along the carrying guide 20 and force the parts 91 on the guide to move forward.

Each carrying chain 28 is stretched between two pairs of wheels 29a and 29b, each pair of which has two oppositely disposed wheels, one pair is located at the upstream side end of the carrying guide 20, while the other at the downstream side end. One pair of wheels, 29b links a drive motor 29. Two lines of the carrying chain 28, 28 are provided with attaching pieces 281 which are opposite to each other and of equal spacings between both the adjacent ones. Between the oppositely disposed attaching pieces 281, 281, a push rod 282 is provided which moves on the guide 20. When the push rod 282 moves, the back of the electronic part 91 on the carrying guide 20 is pushed to move forward. On a carry-in side and a carry-out side of the carrying portion 2, the supply portion 3 and the collecting portion 8 are provided respectively as in the case of the first embodiment and further, on the carrying path, the processing portion 4 which performs information processing onto the electronic parts 91 and the indicating portion 5 which makes a predetermined indication onto the processed parts 91 are also provided.

The supplying portion 3 is provided with an inclined tray mounting frame 19a which has an open-close mechanism 24 at the end of the mounting frame 11 of the carrying portion 2. This mounting frame 19a is attachably and detachably provided with a tubular tray 9. Between the mounting frame 19a and the carrying portion 2, a shoot 10a is equipped, which carries the parts 91 in the tray 19a to the carrying guide 20. The processing portion 4 has the same structure as the first embodiment, and therefore an explanation thereof is omitted.

The labeling apparatus 6 and the printer 7 which constitute the indicating portion 5 are equipped on a fixed table 59a provided on the machine table 1. Therefore, in this embodiment, a peeled off label transfers to a surface of the moving part 91 and passes through beneath the push roller 69 to be affixed. In this embodiment, as in the case of the first one, a movable type of labeling apparatus 6 and printer 7 may, needless to say, be introduced.

The collecting portion 8 is equipped with a tray mounting frame 19b which is installed at the end of the machine table 1 and inclined toward the downstream side, and on the frame 19b, an empty tubular tray 9a is attachably and detachably mounted. Between the frame 19b and the carrying portion 2, a shoot 10b is provided to carry the processed parts 91 in the carrying portion 2 to the tray 9a.

Further, to the supplying portion 3 and the collecting portion 8 of this embodiment, as in the case of the first embodiment, the tray supporting frame 31 which is provided with a plurality of tubular trays 9 in a cylindrical shape may, needless to say, be used.

In the parts processing machine of the first embodiment, in writing information into the electronic parts 91, the tray supporting frame 31 mounts the tubular trays 9 which are charged with many electronic parts 91 and the tray supporting frame 81 on the collecting portion side mounts the empty tubular trays 9.

Now, information to be written by the writing portion 46 and data to be printed by the printer 7 are supplied to the control portion by operating the key of the control portion. At this time, each stopper 45, 50 of the inclination guide 2a is located at the parts guide face 23 of the inclination guide 2a and the part 91 supplied from the tray 9 is stopped by the upstream side stopper 40 of the inclination guide 2a to wait sliding. When the stopper 40 opens, the writing part 91 slides on the part guide face 23 of the inclination guide 2a and is stopped at a process position by the stopper 45. Interlocking to this action, both the arms 47, 47 of the processing portion 4 operate to project the writing portions 46 and the writing terminals 48 are electrically connected to the corresponding electrode 92 of the part 91 to execute information writing in response to the control signal from the control portion. At this time, the next part 91 is waiting at the upstream side stopper 40.

On completion of writing, the writing portions 46 are separated from the part 91 by movement of both the arms 47. Interlocking to this action, the stopper 45 opens to allow the part 91 to slide toward the downstream side. When this part 91 is stopped by the stopper 50 of the indicating portion 5, interlocking to this action, the stepping motors 66, 17 which drive the reel 68 and the ball screw 16 respectively are actuated. At this time, the label on the peel off guide 65 which was previously printed is separated from the peel off guide 65 by transfer of the tape and the table 59 to remain on the surface of the part 91 and receives an action of the pushing roller 69 to be affixed to the part surface. At this time, a next part 91 is carried into the processing portion 4 and is receiving the same writing processing.

The table 59 reciprocates in accordance with the length of the label, and interlocking to the return of the table 59, the stopper 50 opens, thereby allowing the labeled part 91 to go into the tubular tray 81 communicating with the inclination guide 2a and thus to be collected.

In processing the electronic parts 91 in the machine of the second embodiment shown in FIGS. 14-16, the mounting frame 19a on the supply side carries the tubular tray 9 which is charged with the electronic parts 91 and the frame 19b on the collecting side carries the empty tubular tray 9a respectively.

Now, information to be written by the writing portion 46 and data to be printed by the printer 7 are supplied to the control portion by operating the key of the control portion. When the open-close mechanism 24 of the supplying portion 3 performs the open-close operation, one electronic part 91 in the tray 9 slides from the shoot 10a onto the carrying guide 20 of the carrying portion 2. Interlocking to this action, the carrying chains 28, 28 operate to transfer the part 91 on the carrying guide 20 to the process position. Interlocking to this action, the writing portion 46 operates to write information on the part 91. Interlocking to completion of writing, the carrying chains 28, 28 operate again to transmit the processed part 91 to the position of the indicating portion 6 and labeling the surface of the part 91 is performed by the printer 7 and the labeling apparatus 6. Interlocking to completion of labeling, the carrying chains 28, 28 operate again to transmit the processed part 91 from the shoot 10b to the empty tray 9a.

What is claimed is:

1. An electronic parts processing machine for continuously processing and treating electronic parts comprising a carrier means supporting a linear carrying path means, aid electronic parts being carried linearly along said carrying path means, said carrier means being operable to feed said electronic parts one by one along said carrying path means to stop at work stations spaced from one another along said carrying path means, a supply means disposed upstream of said carrying path means and having a plurality of elongated supply tray supports for supporting a plurality of said electronic parts in aligned array, said supply means comprising a supply rotary means rotatable about a rotary axis which slopes downwardly relative to the horizontal, said supply rotary means having an outer periphery, said plurality of elongated supply tray supports being mounted on said outer periphery of said supply rotary means and a sloping downwardly in parallel to said rotary axis, said supply rotary means being rotatable about said rotary axis to different rotary positions such that in each rotary position one of said elongated supply tray supports is aligned with said carrying path, said supply means having feed control means for feeding said electronic parts one at a time onto said carrying path means as said electronic parts slide by their own weight along said aligned sloping tray support, a first and second processing means mounted on said carrier means at said work stations and operable to process and treat said electronic parts as said electronic parts are fed one by one along said carrying path means to stop at said work stations, a collection means disposed downstream of said carrying path means and having an elongated collection tray support for supporting a plurality of processed electronic parts in aligned array, said collection tray support being aligned with said carrying path means and being disposed to slope downwardly relative to horizontal such that said collection tray support receives said processed electronic parts one by one from said carrying path means and collects said processed electronic parts in aligned array as said electronic parts slide by their own weight along said sloping collection tray support.

2. An electronic parts processing machine according to claim 1, wherein said carrying path means slopes downwardly relative to horizontal such that said electronic parts slide by their own weight along said carrying path means to said work stations.

3. An electronic parts processing machine according to claim 2, wherein said aligned supply tray support, said carrying path means, and said elongated collection tray support are in contiguous linear alignment such that the electronic parts move along a single continuous straight line path in moving from said supply means to said carrying path means and from said carrying path means to said collection means.

4. An electronic parts processing machine according to claim 1, wherein said carrying path means slopes downwardly relative to horizontal such that said electronic parts slide by their own weight along said carrying path means to said work stations, the slope angle of said downwardly sloping carrying path means, the slope angle of said downwardly sloping supply tray support, and the slope angle of said downwardly sloping collection tray support all being equal.

5. An electronic parts processing machine according to claim 1, wherein said rotary axis of said supply rotary means is designed a first rotary axis, said collection means comprising collection rotary means rotatable about a second rotary axis, said collection rotary means having an outer periphery, a plurality of said elongated collection tray supports being mounted on said outer periphery of said collection rotary means in parallel to said second rotary axis, said collection rotary means being rotatable about said second rotary axis to different rotary positions such that in each rotary position one of said elongated collection tray supports is linearly aligned with said carrying path means.

6. An electronic parts processing machine according to claim 5, wherein said carrier means further comprises a drive means which is connected to said supply means and to said collection means and operable to rotate said supply rotary means and said collection rotary means to said different rotary positions.

7. An electronic parts processing machine according to claim 6, wherein said carrier means further comprises a support structure which supports said carrying path means, said drive means comprising a drive shaft rotatably supported on said support structure, a motor for driving said drive shaft, said motor being mounted on said support structure, said support structure having an upstream end and a downstream end, said drive shaft having an upstream end portion extending beyond said upstream end of said support structure, said supply rotary means being mounted on said upstream end of said drive shaft, said drive shaft having a downstream portion extending beyond said downstream end of said support structure, said collection rotary means being mounted on said downstream end of said drive shaft.

8. An electronic parts processing machine according to claim 2, wherein said carrier means further comprises a support means and adjustable pivotable means pivotably supporting said carrying path means to provide for adjusting the sloping angle of said carrying path means.

9. An electronic parts processing machine according to claim 2, wherein said carrying means comprises a plurality of stopper means each having a movable stopper element and a stopper actuator for actuating said stopper element between a stop position and a non-stop position, said stopper element in said stop position being disposed within the path of travel of said electronic parts to thereby stop said electronic parts from sliding along said carrying path means, said stopper element in said non-stop position being disposed outside the path of travel of said electronic parts to thereby permit said electronic parts to slide by their own weight along said carrying path means.

10. An electronic parts processing machine according to claim 9, wherein said stopper means are disposed along said carrying path means to stop each electronic part at each of said work stations.

11. An electronic parts processing machine according to claim 9, wherein each of said stopper means comprises two pivotably mounted stopper elements, said actuator comprising a solenoid for pivoting said stopper elements.

12. An electronic parts processing machine according to claim 1, wherein one of said processing means comprises a label applying means for applying a label to each of said electronic parts, and reciprocating means for mounting said label applying means on said carrier means for reciprocating movement between a first and second position, said carrier means comprising stopper means for stopping the movement of said electronic parts at one of said working stations, said reciprocating means being operable to move said label applying means from said first to said second positions to apply a label to said electronic part which has stopped at said one working station.

13. An electronic parts processing machine according to claim 1, wherein one of said processing means comprises writing means, said carrier means comprising stopper means for stopping said electronic parts at one of said working stations, and actuating means for actuating said writing means to move said writing means between writing and non-writing positions when each electronic part is stopped at said one working station.

14. An electronic parts processing machine according to claim 13, wherein said writing means comprises a pair of pivotably mounted arms each pivotable between said writing and non-writing positions, said actuating means comprises a solenoid for pivoting said arms.

15. An electronic parts processing machine according to claim 1, wherein said carrying path means comprises a support member having a generally upright part and a transverse part extending transversely to said upright part, said upright part extending above said transverse part, said upright part having an upper terminating end, said electronic parts sliding on said upper terminating end when moving along said carrying path means, said transverse part having a section underlying said electronic parts as said electronic parts slide on said upper terminating end.

16. An electronic parts processing machine according to claim 1, when said carrying means comprises an endless chain means and drive means for driving said endless chain means, said endless chain means having spaced guide means for engaging said electronic parts and moving said electronic parts along said carrier path means into and out of said work stations.

17. An electronic parts processing machine according to claim 16, wherein one of said processing means comprises a label applying means for applying a label to each of said electronic parts, and reciprocating means for mounting said label applying means on said carrier means for reciprocating movement between a first and a second position, said carrier means comprising operable means for stopping the movement of said electronic parts at one of said working stations, said reciprocating means being operable to move said label applying means from said first to said second positions to apply a label to said electronic part which has stopped at said one working station.

18. An electronic parts processing machine according to claim 16, wherein one of said processing means comprises writing means, said carrier means comprising operable means for stopping said electronic parts at one of said working stations, and actuating means for actuating said writing means to move said writing means between writing and non-writing positions when each electronic part is stopped at said one working station.

19. An electronic parts processing machine according to claim 18, wherein said writing means comprises a pair of pivotably mounted arms each pivotable between said writing and non-writing positions, said actuating means comprises a solenoid for pivoting said arms.

20. An electronic parts processing machine according to claim 16, wherein said carrying path means comprises a support member having a generally upright part and a transverse part extending transversely to said upright part, said upright part extending above said transverse part, said upright part having an upper terminating end, said electronic parts sliding on said upper terminating end when moving along said carrying path means, said transverse part having a section underlying said electronic parts as said electronic parts slide on said upper terminating end.

21. An electronic parts processing machine for continuously processing and treating electronic parts comprising a carrier means supporting a linear carrying path means, said electronic parts being carried linearly along said carrying path means, said carrier means being operable to feed said electronic parts one by one along said carrying path means to stop at work stations spaced from one another along said carrying path means, a supply means disposed upstream of said carrying path means and having a plurality of elongated supply tray supports for supporting a plurality of said electronic parts in aligned array, said supply means comprising a supply rotary means rotatable about a rotary axis which slopes downwardly relative to horizontal, said supply rotary means having an outer periphery, said plurality of elongated supply tray supports being mounted on said outer periphery of said supply rotary means and sloping downwardly in parallel to said rotary axis, said supply rotary means being rotatable about said rotary axis to different rotary positions such that in each rotary position one of said elongated supply tray supports is aligned with said carrying path, said supply means having first control means for feeding said electronic parts one at a time onto said carrying path means as said electronic parts slide by their own weight along said aligned sloping supply tray support, a first and second processing means mounted on said carrier means at said work stations and operable to process and treat said electronic parts as said electronic parts are fed one by one along said carrying path means to stop at said work stations, a collection means disposed downstream of said carrying path means and having an elongated collection tray support for supporting a plurality of processed electronic parts in aligned array, said collection tray support being aligned with said carrying path means such that said collection tray support receives said processed electronic parts one by one from said carrying path means and collects said processed electronic parts in aligned array.

22. An electronic parts processing machine for continuously processing and treating electronic parts comprising a carrier means supporting a linear carrying path means, said electronic parts being carried linearly along said carrying path means, said carrier means being operable to feed said electronic parts one by one along said carrying path means to stop at work stations spaced from one another along said carrying path means, a supply means disposed upstream of said carrying path means and having an elongated supply tray support for supporting a plurality of said electronic parts in aligned array, said supply tray support being aligned with said carrying path means, said supply means having feed control means for feeding said electronic parts one at a time onto said carrying path means, a first and second processing means mounted on said carrying means at said work stations and operable to process and treat said electronic parts as said electronic parts are fed one by one along said carrying path means to stop at said work stations, a collection means disposed downstream of said carrying path means and having a plurality of elongated collection tray supports for supporting a plurality of processed electronic parts in aligned array, said collection means comprising collection rotary means rotatable about a rotary axis which slopes downwardly relative to horizontal, said collection rotary means having an outer periphery, said plurality of elongated collection tray supports being mounted on said outer periphery of said collection rotary means and sloping downwardly in parallel to said rotary axis, said collection rotary means being rotatable about said rotary axis to different rotary positions such that in each rotary position one of said elongated collection tray supports is aligned with said carrying path means such that said collection tray support receives said processed electronic parts one by one from said carrying path means and collects said processed electronic parts in aligned array as said electronic parts slide by their own weight along said aligned sloping collection tray support.

* * * * *